US 6,554,973 B2

(12) United States Patent
Nakayama

(10) Patent No.: US 6,554,973 B2
(45) Date of Patent: Apr. 29, 2003

(54) FILM FORMATION METHOD USING SPUTTERING AND PRODUCTION METHOD OF PHOTOVOLTAIC ELEMENT USING SAME

(75) Inventor: Akiya Nakayama, Nara (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/867,632

(22) Filed: May 31, 2001

(65) Prior Publication Data

US 2002/0033331 A1 Mar. 21, 2002

(30) Foreign Application Priority Data

Jun. 1, 2000 (JP) .......................................... 2000-164654

(51) Int. Cl.[7] .............................................. C23C 14/34
(52) U.S. Cl. ............................ 204/192.27; 204/192.12; 204/192.15; 204/192.26; 204/192.22; 204/192.29
(58) Field of Search ........................ 204/192.12, 192.15, 204/192.22, 192.27, 192.26, 192.29

(56) References Cited

U.S. PATENT DOCUMENTS 4,125,446 A * 11/1978 Hartsough et al. ........ 204/192 P
5,367,179 A    11/1994 Mori et al. ..................... 257/59
5,620,530 A     4/1997 Nakayama .................. 136/259
5,911,856 A *  6/1999 Suzuki et al. ........... 204/192.13

OTHER PUBLICATIONS

JP 61–64874 abstract.
JP 5–171434 abstract.
JP 6–116722 abstract.
JP 11–236666 abstract.
JP 2–163363 abstract.

* cited by examiner

Primary Examiner—Steven H. VerSteeg
(74) Attorney, Agent, or Firm—Fitzpatrick, Cella, Harper & Scinto

(57) ABSTRACT

In a film formation method comprising introducing a sputtering gas into a film forming chamber and forming a film on a substrate therein, the partial pressure of $H_2O$ in an atmosphere inside the film forming chamber is controlled so as to satisfy prescribed conditions, thereby forming a reflective layer of a prescribed reflectance on the substrate, thereby providing a film formation method using sputtering and a production method of a photovoltaic element using the film formation method that attain stable good film formation even during long-time sputter film formation, can constantly form a reflective film with a desired reflectance, has excellent workability and durability, and constantly attain high photoelectric conversion efficiency.

17 Claims, 4 Drawing Sheets

FILM FORMATION METHOD USING SPUTTERING AND PRODUCTION METHOD OF PHOTOVOLTAIC ELEMENT USING SAME

BACKGROUND OF THE INVENTION

1. Field of the Invention

The present invention relates to a film formation method using sputtering and a production method of a photovoltaic element using the film formation method, and more particularly to a method of producing a reflective metal layer and a transparent conductive layer stacked thereon by means of a sputtering apparatus.

2. Related Background Art

As the prior art film formation method using sputtering, there is described in, for example, Japanese Patent Application Laid-Open No. 61-64874 a method of forming an oxide film by sputtering which adopts a water vapor concentration of 12% by volume or more and a sputtering gas pressure of 2 mTorr or less to provide a dense, high-quality sputter film and to prevent step-breaking of a wire vaporized on the sputter film.

Further, Japanese Patent Application Laid-Open No. 11-236666 discloses providing a sputtering apparatus mainly composed of a vacuum apparatus with a mass spectrometer and a spectrophotometer, measuring an $H_2O$ partial pressure inside the sputter film formation apparatus before and during the film formation, and feeding back the measurement results to adjust the $H_2O$ partial pressure, thus constantly forming a dielectric film of a desired dielectric constant.

Moreover, Japanese Patent Application Laid-Open No. 5-171434 describes effecting exhaust of a sputtering chamber to reduce the inner pressure only to $5\times10^{-5}$ to $5\times10^{-4}$ Torr to leave some air in the sputtering chamber and depositing nitrogen, oxygen or hydrogen of the remaining air along with sputter particles to provide a high-quality Al-based alloy film.

In addition, Japanese Patent Application Laid-Open No. 6-116722 discloses continuously forming a metal layer and a transparent conductive layer on a long substrate by sputtering while moving the substrate (Roll-to-roll process).

The addition of $H_2O$ during sputter film formation in the above mentioned methods provides a deposited film with considerably high quality.

However, in order to mass-produce deposited films with higher quality at a lower cost, there remain the problems to be solved as follows.

For example, the methods described in Japanese Patent Application Laid-Open Nos. 61-64874 and 11-236666 of the above mentioned prior art are techniques accomplished by paying attention to $H_2O$ content, and more specifically the method described in Japanese Patent Application Laid-Open No. 61-64874 is accomplished by paying attention to the dielectric constants of dielectric films, but there is no disclosure or suggestion therein of the relationship between deposited films comprised of a metal or metal compound and $H_2O$, especially forming a deposited film comprised of a metal or metal compound while maintaining $H_2O$ partial pressure within a predetermined range and applying the deposited film to photovoltaic elements such as solar cells.

Further, the method described in Japanese Patent Application Laid-Open No. 11-236666 is accomplished by paying attention to the shapes of deposited films, but there is no disclosure or suggestion therein of optical characteristics represented by reflectance or the like of deposited films.

Moreover, Japanese Patent Application Laid-Open No. 5-171434 has no description of specific $H_2O$ content, and use of only the $H_2O$ content controlling method defined therein may lead to variability of characteristics of deposited films due to a large variance of $H_2O$ content resulting from, e.g., a change in the temperature and humidity of an atmosphere during maintenance and a change in the surface area or material of the inner wall of a film formation chamber.

Further, although the problem in long-time film formation using a long substrate by, e.g., the roll-to-roll process is to constantly maintain characteristics, there is no description in the above mentioned patent gazettes of characteristic stability during long-time film formation by the roll-to-roll process and application of deposited films to photovoltaic elements. That is, with long-time film formation by the roll-to-roll process, only rear surface reflective layers with large variability of characteristics such as reflectance or the like of rear surface reflective films can be formed due to change in the film forming atmosphere and the target surface state. For example, when the target material is a low-melting metal such as In, there is a case where the rise in temperature of the target during the film formation may melt a part of a surface of the target to vary the sputtering efficiency. Photovoltaic elements obtained by stacking a photoelectric conversion layer and a transparent electrode layer using such a rear surface reflective layer with large variability of characteristics will have large variability of photoelectric conversion efficiency and give rise to lowering in photoelectric conversion efficiency. Further, applying a pulling force of about 15000 $\mu\epsilon$ to such a photovoltaic element will generate a number of cracks therein, and an increase in resistance due to extension of a wiring route will lower photoelectric conversion efficiency, so that workability and durability may be lowered.

SUMMARY OF THE INVENTION

It is, therefore, an object of the present invention to provide a film formation method using sputtering and a production method of a photovoltaic element using the film formation method that solve the above mentioned problems of the prior art, attain stable good film formation even during long-time sputter film formation, can constantly form a reflective film with a desired reflectance, has excellent workability and durability, and constantly attain high photoelectric conversion efficiency.

In order to attain the above mentioned object, the present invention provides a film formation method using sputtering and a production method of a photovoltaic element using the film formation method featured by (1)–(17) below.

(1) A film formation method using sputtering which comprises introducing a sputtering gas into a film forming chamber and forming a film on a substrate therein, wherein the partial pressure of $H_2O$ in an atmosphere inside the film forming chamber is controlled so as to satisfy prescribed conditions, thereby forming a reflective layer of a prescribed reflectance on the substrate.

(2) The method as mentioned in (1) above, wherein the partial pressure of $H_2O$ in the atmosphere is controlled so as to be not less than $6.6\times10^{-4}$ Pa but no more than $1.4\times10^{-2}$ Pa.

(3) The method as mentioned in (1) above, wherein during the film formation, the partial pressures of $H_2O$ at the beginning and completion of the film formation are each controlled so as to be not less than $6.6\times10^{-4}$ Pa but no more than $1.4\times10^{-2}$ Pa.

(4) The method as mentioned in (1) above, wherein during the film formation, the partial pressures of $H_2O$ at the beginning and completion of the film formation are each controlled so as to be not less than $2.6\times10^{-3}$ Pa but no more than $6.7\times10^{-3}$ Pa.

(5) The method as mentioned in any one of (1)–(4) above, wherein the partial pressure of $H_2O$ is detected during the film formation.

(6) The method as mentioned in (5) above, wherein the partial pressure of $H_2O$ is controlled based on the result of the detection.

(7) The method as mentioned in (6) above, wherein the partial pressure of $H_2O$ is controlled by supplying $H_2O$ into the film forming chamber and adjusting the concentration of the $H_2O$.

(8) The method as mentioned in any one of (5)–(7) above, wherein the detection is effected using a tetrode mass spectrometer.

(9) The method as mentioned in any one of (1)–(8) above, wherein prior to the film formation, the interior of the film forming chamber is baked.

(10) The method as mentioned in any one of (1)–(9) above, wherein the film comprises a metal.

(11) The method as mentioned in (10) above, wherein the metal is Al, Ag or Cu.

(12) The method as mentioned in any one of (1)–(9) above, wherein the film comprises a metal oxide.

(13) The method as mentioned in (12) above, wherein the metal oxide is a metal oxide containing at least one selected from Al, In, Sn, Zn, and Ti.

(14) The method as mentioned in any one of (1)–(13) above, wherein the substrate is a belt-like substrate, and the film is formed on the belt-like substrate while successively moving the belt-like substrate.

(15) A method of producing a photovoltaic element comprising a rear surface reflective layer, a photoelectric conversion layer and a transparent electrode layer on a substrate, which comprises forming the rear surface reflective layer using the film formation method as mentioned in any one of (1)–(14) above.

(16) A method of producing a photovoltaic element comprising a transparent conductive layer, a photoelectric conversion layer and a transparent electrode layer on a substrate, which comprises forming the transparent conductive layer using the film formation method as mentioned in any one of (1)–(14) above.

(17) A method of producing a photovoltaic element comprising a rear surface reflective layer, a transparent conductive layer, a photoelectric conversion layer and a transparent electrode layer on a substrate, which comprises forming at least one of the rear surface reflective layer and the transparent conductive layer using the film formation method as mentioned in any one of (1)–(14) above.

DETAILED DESCRIPTION OF THE PREFERRED EMBODIMENTS

In the preferred embodiments of the present invention as hereinafter described, by adopting the above mentioned features, controlling $H_2O$ partial pressure during formation of a reflective layer and a transparent conductive layer makes it possible to form deposited films with good photoelectric conversion efficiency.

Further, it becomes possible to continuously attain high photoelectric conversion efficiency for a long period of time.

Moreover, it becomes possible to provide deposited films that have high uniformity and improve photoelectric conversion efficiency when applied to photoelectric conversion elements.

In addition, it becomes possible to produce photoelectric conversion elements that are difficult to be cracked and have high workability and durability.

Thus, it becomes possible to produce low-cost, high-reliability photoelectric conversion elements that can contribute to wide use of solar cells as a system power.

The present inventor has conducted extensive studies focussing attention particularly to the relation between $H_2O$ partial pressure and quality of deposited films or element structures in order to attain higher characteristics and higher stability at the same time for deposited films produced during long-time sputter film formation by the roll-to-roll process or the like, and found that when forming a rear surface reflective layer of a prescribed reflectance on a substrate, controlling the partial pressure of $H_2O$ in an atmosphere inside a film forming chamber so as to satisfy prescribed conditions, e.g., forming a film under the condition of not less than $6.6\times10^{-4}$ Pa but no more than $1.4\times10^{-2}$ Pa is highly effective for long-time film formation, thus accomplishing the present invention.

Preferred embodiments of the present invention will be described in detail below with reference to the drawings.

Figure 1:
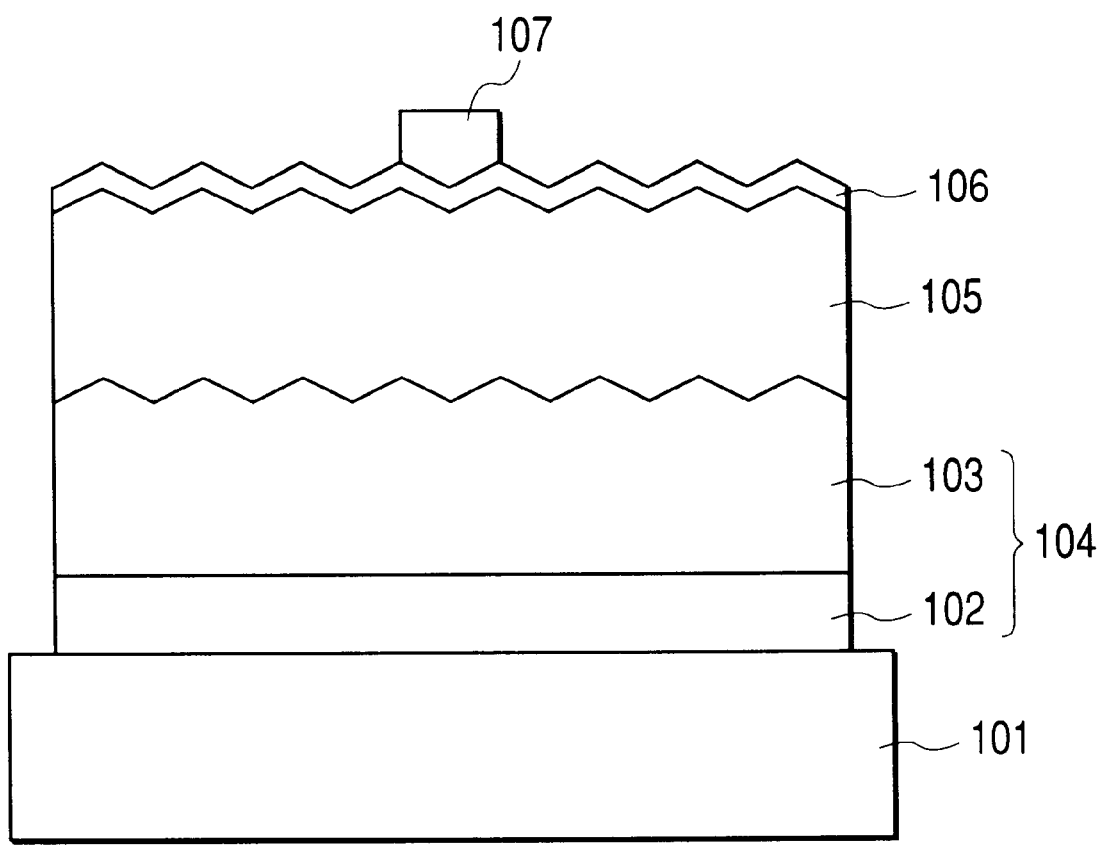
FIG. 1 is a schematic sectional view showing an example of the photoelectric conversion element in accordance with Embodiment and Example of the present invention.

FIG. 1 is a schematic sectional view of a photoelectric conversion element in accordance with the present embodiment, wherein on a substrate 101 are stacked a rear surface reflective layer 104 consisting of a reflective layer 102 and a transparent conductive layer 103, a semiconductor layer 105, a transparent electrode 106, and a current collecting electrode 107 in the mentioned order.

Figure 2A:
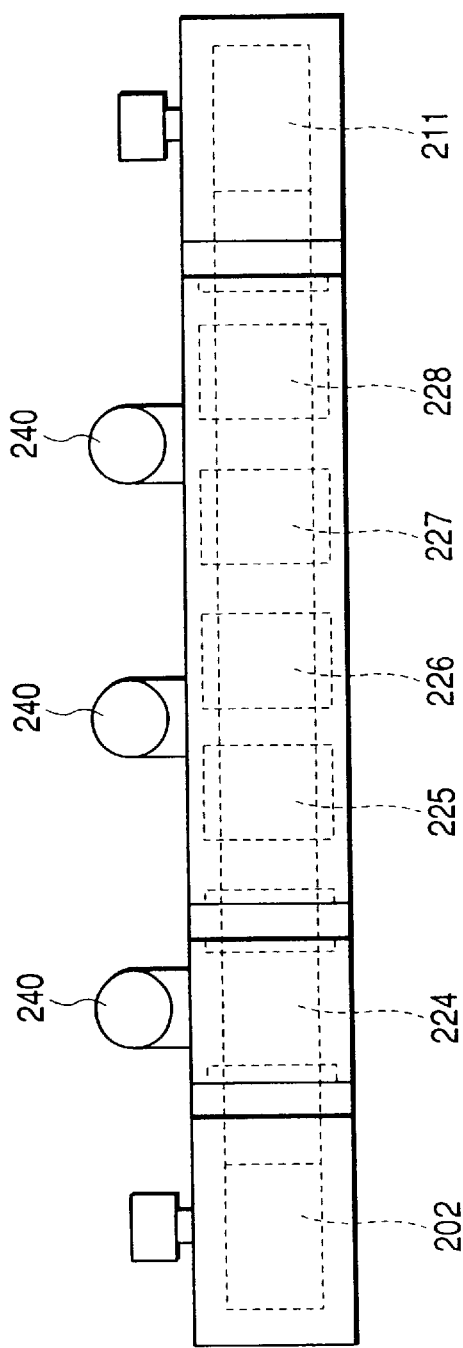
FIG. 2A is a schematic plan view showing the structure of an example of a production apparatus for forming on a long substrate the photoelectric conversion element of FIG. 1 in accordance with Embodiment and Example of the present invention and FIG. 2B is a schematic sectional view showing the structure of the production apparatus.
Figure 2B:
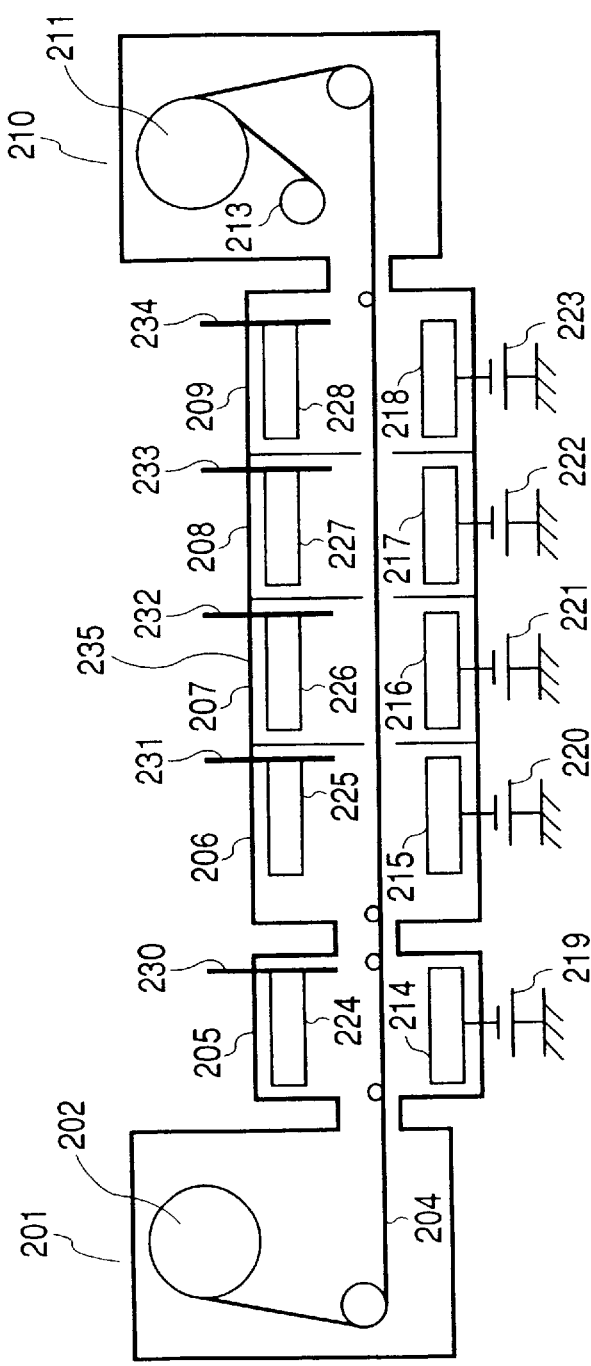

FIGS. 2A and 2B are respectively a schematic plan view and a schematic sectional view showing the structure of an example of a production apparatus for forming on a long substrate the photoelectric conversion element shown in FIG. 1. Using the apparatus, film formation is carried out by the following procedure (or steps) (1)–(7) as described below.

(1) A substrate 204 is unwound from a substrate roll 202 housed in a feeding chamber 201 and the end of the substrate 204 is set in a winding chamber 210, and vacuum exhaust is effected by vacuum pumps 240.

(2) After completion of the vacuum exhaust to a given pressure, an inert gas such as argon gas or the like is supplied through gas supply pipes 230, 231, 232, 233, 234 and a given pressure is attained by adjusting the degree of opening of an exhaust valve (not shown).

(3) A plurality of infrared ray lamps of heater units 224, 225, 226, 227, 228 provided in respective chambers are turned on to heat the substrate to a film forming temperature.

(4) When the film forming temperature is reached, the partial pressure of $H_2O$ inside the apparatus is measured with a tetrode mass spectrometer 235. Based on the result of the measurement, the partial pressure of $H_2O$ is adjusted utilizing data as collected beforehand such that the formed rear surface reflective film has a desired reflectance.

(5) Then, a winding roll 211 is rotated by a servomotor (not shown) to move the substrate 101, 204 at a constant speed, and film formation is started.

(6) First, in a reflective layer forming chamber 205, sputtering is effected with a DC power source 219 using a target 214 of aluminum or an aluminum-based material as a cathode electrode to form the reflective layer 102. Magnetron sputtering may also be used.

(7) Then, the substrate 204 having the reflective layer 102 thereon is moved, sputtering is effected with DC power sources 220, 221, 222, 223 using targets 215, 216, 217, 218 each containing zinc oxide as a main component to form the transparent conductive layer 103, and the substrate is wound in the winding chamber 210. At this time, by suitably selecting the forming temperature and the DC power, unevenness with a size of several 100 nm can be formed in the surface of the transparent conductive layer 103 to utilize the effect of scattering of light. In FIG. 1 the unevenness is schematically depicted in an emphasized manner.

By the above mentioned procedure, the reflective layer and the transparent conductive layer are successively formed on the substrate. Further, by using a separate deposition apparatus, a semiconductor layer and a transparent electrode are formed, and a current collecting electrode is formed thereon. Moreover, a protective resin may further be provided thereon.

The reflective layer and transparent conductive layer as formed by the above mentioned procedure maintains good reflectance over the entire region of the rear surface reflective layer of the long substrate over an extended period of time, so that a light as reflected therein is efficiently absorbed by the semiconductor layer to show improved photoelectric conversion efficiency.

This is attributable to the findings by the inventor that the partial pressure of $H_2O$ in the above mentioned step (4) is correlated with the photoelectric conversion efficiency of photovoltaic elements.

Figure 3:
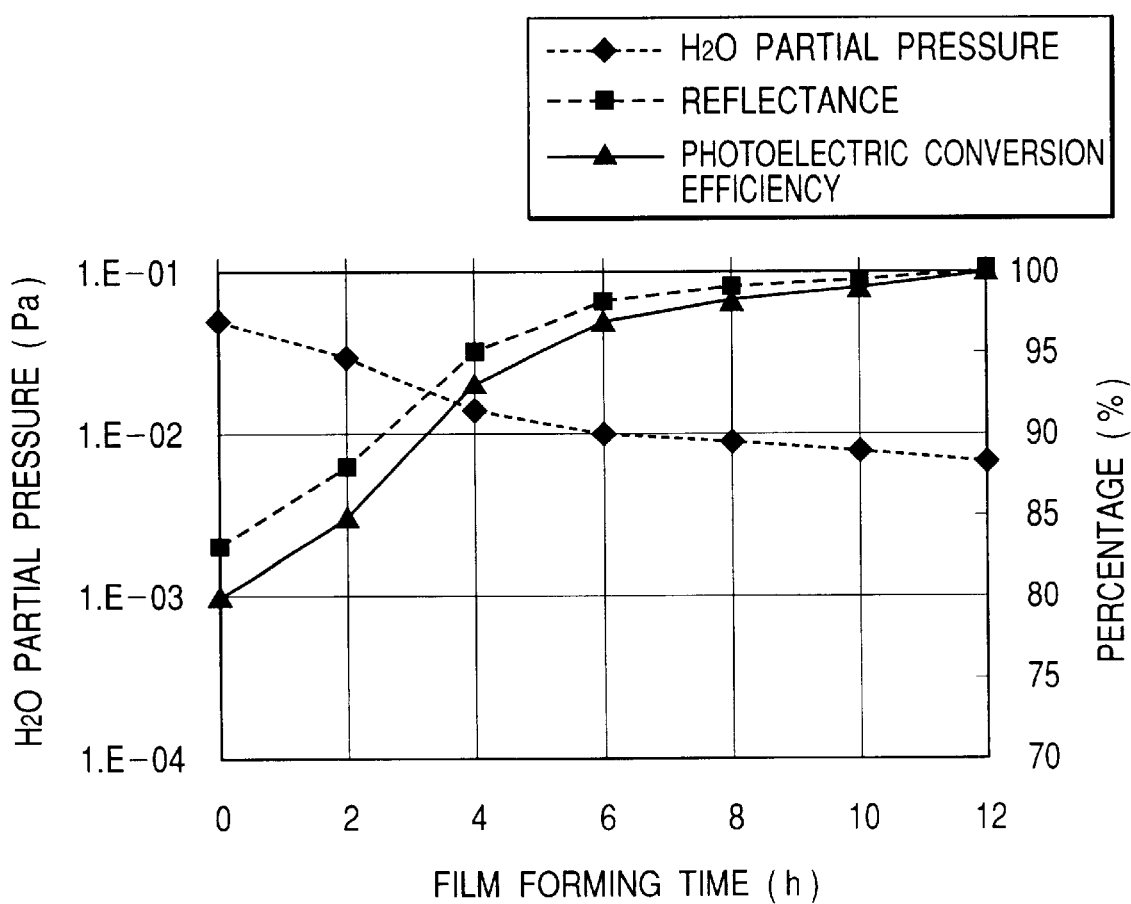
FIG. 3 is a graphical representation explaining the dependency of the reflectance of a transparent conductive layer on $H_2O$ partial pressure.
Figure 4:
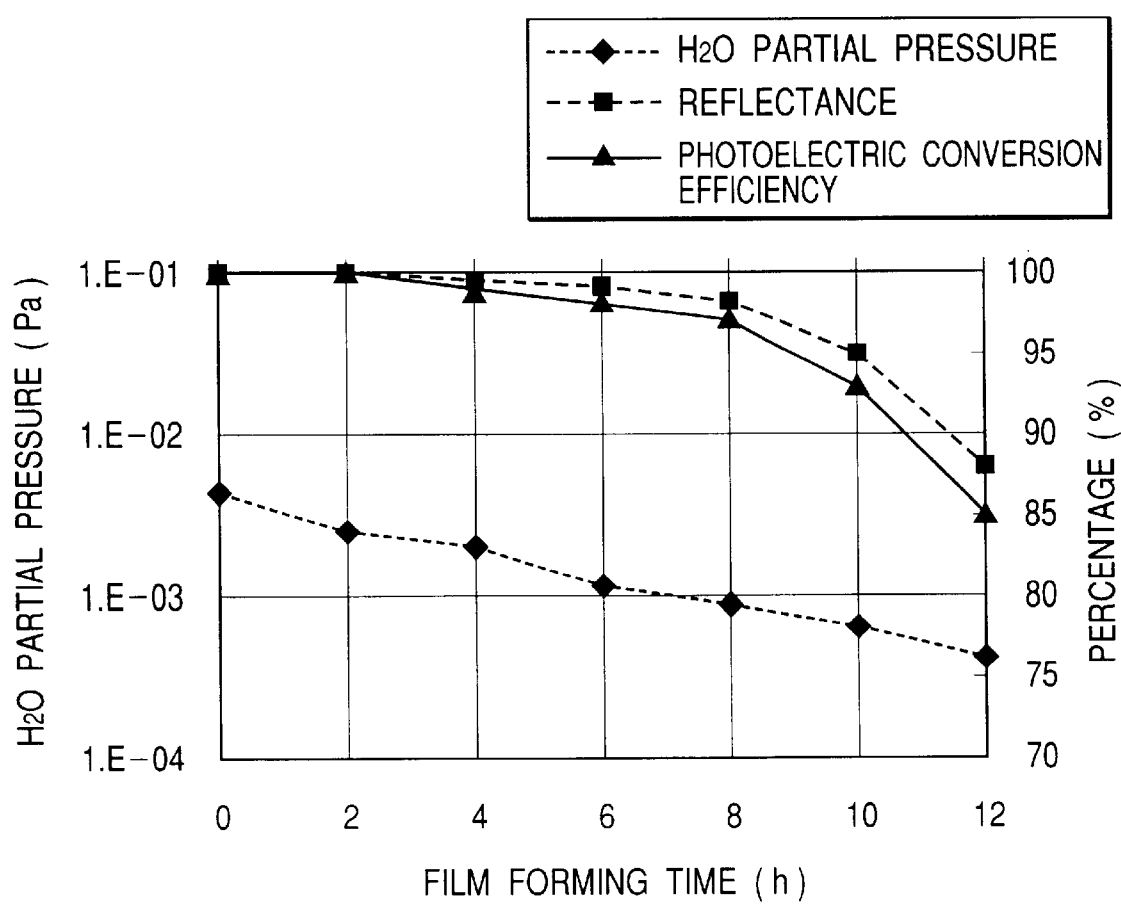
FIG. 4 is a graphical representation explaining the dependency of the reflectance of a transparent conductive layer on $H_2O$ partial pressure.

Specifically explaining, the reflectance of the reflective layer 102 and transparent conductive layer 103 formed in the above mentioned steps (6)–(7) varies depending on the partial pressure of $H_2O$ as shown in FIGS. 3 and 4, so that Jsc (short circuit photo-current density) also varies to affect the photoelectric conversion efficiency. It is seen from the figures that controlling the $H_2O$ partial pressure so as to be within the prescribed range improves the photoelectric conversion efficiency, but $H_2O$ partial pressure out of the prescribed range lowers the photoelectric conversion efficiency as shown in FIG. 4. The dependency of the photoelectric conversion efficiency on the $H_2O$ partial pressure inside the film forming chamber is as shown in Table 1 below.

The present inventor believes that the variation in the photoelectric conversion efficiency is correlated with the variation in the reflectance of the rear surface reflective layer, and a major reason for the variation in the reflectance is that grain boundaries of the reflective layer and the transparent conductive layer develop and absorb the light to lower the reflectance. As the method of controlling the $H_2O$ partial pressure, there may be used baking or a method of purging the rear surface reflective layer forming chamber with a gas of a given composition prior to the film formation. Although the present invention has been described taking the roll-to-roll process as an example, the present invention is not limited to use of the roll-to-roll process but can be applied to any processes of moving a long substrate intermittently.

TABLE 1

| $H_2O$ Partial Pressure (Pa) | Reflectance | Photoelectric Conversion Efficiency |
|---|---|---|
| $2 \times 10^{-4}$ | x | x |
| $6.6 \times 10^{-4}$ | Δ | Δ |
| $1.1 \times 10^{-3}$ | ○ | ○ |
| $2.6 \times 10^{-3}$ | ⊚ | ⊚ |
| $6.7 \times 10^{-3}$ | ⊚ | ⊚ |
| $9.4 \times 10^{-3}$ | ○ | ○ |
| $1.4 \times 10^{-2}$ | Δ | Δ |
| $4 \times 10^{-2}$ | x | x |

In Table 1, the symbols have the following meanings.
⊚: 100%
○: not less than 95% but less than 100%
Δ: not less than 90% but less than 95%
x: not less than 80% but less than 90%

The above percentages represent relative values when the reflectance and the photoelectric conversion efficiency obtained at the $H_2O$ partial pressure of $2.6 \times 10^{-3}$ Pa are taken as 100%.

The present invention will now be described in detail with reference to examples thereof, although it will be readily appreciated that the invention is not limited to such examples.

(Example 1)

In Example 1, a photoelectric conversion element with the constitution schematically shown in FIG. 1 was produced using the apparatus as shown in FIG. 2. After the apparatus of FIG. 2 was opened to the atmosphere for the purpose of maintenance or the like, the substrate roll 202 was set in the substrate feeding chamber 201, and the substrate 204 was caused to pass through the reflective layer forming chamber 205 and the respective transparent conductive layer forming chambers 206, 207, 208, 209 and set in the roll 211 in the substrate winding chamber 210. As the substrate 204, there was used SUS430 of 120 mm in width, 0.15 mm in thickness and 150 m in length having an unevenness formed in its surface with dull finishing. Then, exhaust was effected until an inner pressure of $10^{-4}$ Torr or less was attained.

Thereafter, argon gas as an inert gas was supplied at 30 sccm through the gas supply pipes 230, 231, 232, 233, 234 to each of the reflective layer forming chamber 205 and the transparent conductive layer forming chambers 206, 207, 208, 209. Further, argon gas was supplied at 30 sccm to the gates. In this state, the degree of opening of an exhaust valve (not shown) was adjusted to maintain the pressures inside the vacuum chambers at 3 mTorr. The heater units 224, 225, 226, 227, 228 each consisting of a set of six infrared ray lamps of 100 w provided along with a stainless steel reflector in the reflective layer forming chamber 205 and the transparent conductive layer forming chambers 206, 207, 208, 209 were turned on to heat the substrate, and the substrate temperature was controlled so as to be 200° C. by bringing a thermocouple into contact with the surface opposite to the film forming surface of the substrate.

After the given temperature was reached in about 10 minutes, the partial pressure of H$_2$O inside the apparatus was measured with the tetrode mass spectrometer 235. Based on the result of the measurement, the partial pressure of H$_2$O was adjusted utilizing data as collected beforehand such that the formed rear surface reflective film had a desired reflectance.

Subsequently, the winding roll 211 was rotated by energizing a servomotor (not shown) to start movement of the substrate 204 at a speed of 170 mm/min. As the target 214 for reflective layer formation, an aluminum (purity: 99.99% by weight) of a 25 cm× 25 cm size was used, and a DC power of 400 W was applied thereto.

During the passage of the substrate 204 above the target 214 in about 90 seconds, the aluminum reflective layer 102 of about 200 nm in thickness was formed on the substrate. The substrate 204 was further moved through the transparent conductive layer forming chambers 206, 207, 208, 209.

As each target 215, 216, 217, 218, zinc oxide (purity: 99.99% by weight) of a 25 cm× 25 cm size was used, and a DC power of 2800 W was applied each target. During the passage of the substrate 204 through the spaces in about 180 seconds, the transparent conductive layer 103 of zinc oxide was formed in about 1000 nm thickness. Incidentally, at this time, an unevenness with an elevation difference of several 100 nm was developed in the surface of the transparent conductive layer.

The substrate 204 having the transparent conductive layer formed therein was wound in the winding chamber 210. At this time, a sheet of synthetic paper 213 of a polyester film was sandwiched between adjacent substrates during the winding to prevent injury of the surface of the transparent conductive layer. This state was maintained for about 12 hours to form the reflective layer and transparent conductive layer in a length of about 120 m at the substrate moving speed of 170 mm/min.

A part of the substrate having the reflective layer and transparent conductive layer formed at an H$_2$O partial pressure within the range of $2.6 \times 10^{-3}$ to $6.7 \times 10^{-3}$ Pa was put out and measured for reflectance by a spectrophotometer, and the reflectance at 800 nm wavelength was taken as 100% and defined as a comparison standard of reflectance.

Further, the substrate having the reflective layer and transparent conductive layer formed was cut into a piece of 5 cm square; the semiconductor layer 105, the transparent electrode 106 and the current collecting electrode 107 were deposited thereon in a separate apparatus; characteristic evaluation was effected therefor under light irradiation of AM1.5 (100 mW/cm$^2$); and the photoelectric conversion efficiency as obtained therefor was taken as 100% and defined as a comparison standard of photoelectric conversion efficiency.

(Example 2)

A substrate was produced by following the procedure of Example 1 with the exception that after the vacuum exhaust and gas supply, the reflective layer was formed with the H$_2$O partial pressure inside the reflective layer forming chamber being within the range of $2.6 \times 10^{-3}$ to $6.7 \times 10^{-3}$ Pa and the transparent conductive layer was formed with the H$_2$O partial pressures inside the transparent conductive layer forming chambers being each outside the range of $2.6 \times 10^{-3}$ to $6.7 \times 10^{-3}$ Pa. When the thus produced substrate was measured for reflectance by a spectrophotometer, the reflectance at 800 nm wavelength was 99% on the basis of 100% for Example 1. Further, when the photoelectric conversion efficiency was measured, it was 98% on the basis of 100% for Example 1.

(Example 3)

A substrate was produced by following the procedure of Example 1 with the exception that after the vacuum exhaust and gas supply, the transparent conductive layer was formed with the H$_2$O partial pressures inside the transparent conductive layer forming chambers being each within the range of $2.6 \times 10^{-3}$ to $6.7 \times 10^{-3}$ Pa and the reflective layer was formed with the H$_2$O partial pressure inside the reflective layer forming chamber being outside the range of $2.6 \times 10^{-3}$ to $6.7 \times 10^{-3}$ Pa. When the thus produced substrate was measured for reflectance by a spectrophotometer, the reflectance at 800 nm wavelength was 98% on the basis of 100% for Example 1. Further, when the photoelectric conversion efficiency was measured, it was 97% on the basis of 100% for Example 1.

(Comparative Example 1)

A substrate was produced by following the procedure of Example 1 with the exception that after the vacuum exhaust and gas supply, the reflective layer and transparent conductive layer were formed with the H$_2$O partial pressures inside the reflective layer forming chamber and the transparent conductive layer forming chambers being each outside the range of $6.6 \times 10^{-4}$ to $1.4 \times 10^{-2}$ Pa. When the substrate having the reflective layer and transparent conductive layer formed was measured for reflectance by a spectrophotometer, the reflectance at 800 nm wavelength was 88% on the basis of 100% for Example 1. Further, when the photoelectric conversion efficiency was measured, it was 85% on the basis of 100% for Example 1. Further, a pulling force of 15000 $\mu\epsilon$ was applied to the photovoltaic elements as produced in Example 1 and Comparative Example 1 and generation of cracks therein was observed, with the result that the photovoltaic element of Example 1 had less cracks and showed higher workability and durability than that of Comparative Example 1.

(Example 4)

A substrate was produced by following the procedure of Example 1 with the exception that after the vacuum exhaust and gas supply, the reflective layer was formed with the H$_2$O partial pressure inside the reflective layer forming chamber being within the range of $2.6 \times 10^{-3}$ to $6.7 \times 10^{-3}$ Pa and the transparent conductive layer was formed by plating. When the thus produced substrate was measured for reflectance by a spectrophotometer, the reflectance at 800 nm wavelength was 100% on the basis of 100% for Example 1. Further, when the photoelectric conversion efficiency was measured, it was 100% on the basis of 100% for Example 1.

(Comparative Example 2)

A substrate was produced by following the procedure of Example 4 with the exception that after the vacuum exhaust and gas supply, the reflective layer was formed with the H$_2$O partial pressure inside the reflective layer forming chamber being outside the range of $6.6 \times 10^{-4}$ to $1.4 \times 10^{-2}$ Pa. When the thus produced substrate was measured for reflectance by a spectrophotometer, the reflectance at 800 nm wavelength was 88% on the basis of 100% for Example 1. Further, when the photoelectric conversion efficiency was measured, it was 85% on the basis of 100% for Example 1.

(Example 5)

A substrate was produced by following the procedure of Example 1 with the exception that Ag was used for the reflective layer, and after the vacuum exhaust and gas supply, the reflective layer and transparent conductive layer were formed with the H$_2$O partial pressures inside the reflective layer forming chamber and the transparent conductive layer forming chambers being each within the range of $2.6 \times 10^{-3}$ to $6.7 \times 10^{-3}$ Pa. A part of the substrate having the reflective layer using Ag and transparent conductive layer formed at the $H_2O$ partial pressures within the range of $2.6 \times 10^{-3}$ to $6.7 \times 10^{-3}$ Pa was put out and measured for reflectance by a spectrophotometer, and the reflectance at 800 nm wavelength was taken as 100% and defined as a comparison standard of reflectance. Further, the substrate having the reflective layer and transparent conductive layer formed was cut into a piece of 5 cm square; the semiconductor layer, the transparent electrode and the current collecting electrode were deposited thereon in a separate apparatus; characteristic evaluation was effected therefor under light irradiation of AM1.5 (100 mW/cm$^2$); and the photoelectric conversion efficiency as obtained therefor was taken as 100% and defined as a comparison standard of photoelectric conversion efficiency.

(Example 6)

A substrate was produced by following the procedure of Example 5 with the exception that after the vacuum exhaust and gas supply, the reflective layer was formed with the $H_2O$ partial pressure inside the reflective layer forming chamber being within the range of $2.6 \times 10^{-3}$ to $6.7 \times 10^{-3}$ Pa and the transparent conductive layer was formed with the $H_2O$ partial pressures inside the transparent conductive layer forming chambers being each outside the range of $2.6 \times 10^{-3}$ to $6.7 \times 10^{-3}$ Pa. When the thus produced substrate was measured for reflectance by a spectrophotometer, the reflectance at 800 nm wavelength was 99% on the basis of 100% for Example 5. Further, when the photoelectric conversion efficiency was measured, it was 98% on the basis of 100% for Example 5.

(Example 7)

A substrate was produced by following the procedure of Example 5 with the exception that after the vacuum exhaust and gas supply, the transparent conductive layer was formed with the $H_2O$ partial pressures inside the transparent conductive layer forming chambers being each within the range of $2.6 \times 10^{-3}$ to $6.7 \times 10^{-3}$ Pa and the reflective layer was formed with the $H_2O$ partial pressure inside the reflective layer forming chamber being outside the range of $2.6 \times 10^{-3}$ to $6.7 \times 10^{-3}$ Pa. When the thus produced substrate was measured for reflectance by a spectrophotometer, the reflectance at 800 nm wavelength was 98% on the basis of 100% for Example 5. Further, when the photoelectric conversion efficiency was measured, it was 97% on the basis of 100% for Example 5.

(Comparative Example 3)

A substrate was produced by following the procedure of Example 5 with the exception that after the vacuum exhaust and gas supply, the reflective layer and transparent conductive layer were formed with the $H_2O$ partial pressures inside the reflective layer forming chamber and the transparent conductive layer forming chambers being each outside the range of $6.6 \times 10^{-4}$ to $1.4 \times 10^{-2}$ Pa. When the substrate having the reflective layer and transparent conductive layer formed was measured for reflectance by a spectrophotometer, the reflectance at 800 nm wavelength was 88% on the basis of 100% for Example 5. Further, when the photoelectric conversion efficiency was measured, it was 85% on the basis of 100% for Example 5.

(Example 8)

A substrate was produced by following the procedure of Example 5 with the exception that after the vacuum exhaust and gas supply, the reflective layer was formed with the $H_2O$ partial pressure inside the reflective layer forming chamber being within the range of $2.6 \times 10^{-3}$ to $6.7 \times 10^{-3}$ Pa and the transparent conductive layer was formed by plating. When the thus produced substrate was measured for reflectance by a spectrophotometer, the reflectance at 800 nm wavelength was 100% on the basis of 100% for Example 5. Further, when the photoelectric conversion efficiency was measured, it was 100% on the basis of 100% for Example 5.

(Comparative Example 4)

A substrate was produced by following the procedure of Example 8 with the exception that after the vacuum exhaust and gas supply, the reflective layer was formed with the $H_2O$ partial pressure inside the reflective layer forming chamber being outside the range of $6.6 \times 10^{-4}$ to $1.4 \times 10^{-2}$ Pa. When the thus produced substrate was measured for reflectance by a spectrophotometer, the reflectance at 800 nm wavelength was 88% on the basis of 100% for Example 5. Further, when the photoelectric conversion efficiency was measured, it was 85% on the basis of 100% for Example 5.

(Example 9)

A substrate was produced by following the procedure of Example 1 with the exception that after the vacuum exhaust and gas supply, the rear surface reflective layer consisting solely of the reflective layer and having no transparent conductive layer was formed in the reflective layer forming chamber with the $H_2O$ partial pressure inside the reflective layer forming chamber being within the range of $2.6 \times 10^{-3}$ to $6.7 \times 10^{-3}$ Pa. A part of the substrate having the reflective layer formed at the $H_2O$ partial pressure within the range of $2.6 \times 10^{-3}$ to $6.7 \times 10^{-3}$ Pa was put out and measured for reflectance by a spectrophotometer, and the reflectance at 800 nm wavelength was taken as 100% and defined as a comparison standard of reflectance. Further, the substrate having the reflective layer formed was cut into a piece of 5 cm square; the semiconductor layer, the transparent electrode and the current collecting electrode were deposited thereon in a separate apparatus; characteristic evaluation was effected therefor under light irradiation of AM1.5 (100 mW/cm$^2$); and the photoelectric conversion efficiency as obtained therefor was taken as 100% and defined as a comparison standard of photoelectric conversion efficiency.

(Comparative Example 5)

A substrate was produced by following the procedure of Example 9 with the exception that after the vacuum exhaust and gas supply, the rear surface reflective layer consisting solely of the reflective layer and having no transparent conductive layer was formed in the reflective layer forming chamber with the $H_2O$ partial pressure inside the reflective layer forming chamber being outside the range of $6.6 \times 10^{-4}$ to $1.4 \times 10^{-2}$ Pa. When the thus produced substrate was measured for reflectance by a spectrophotometer, the reflectance at 800 nm wavelength was 88% on the basis of 100% for Example 9. Further, when the photoelectric conversion efficiency was measured, it was 85% on the basis of 100% for Example 9.

(Example 10)

A substrate was produced by following the procedure of Example 1 with the exception that after the vacuum exhaust and gas supply, the rear surface reflective layer consisting solely of the reflective layer of Ag and having no transparent conductive layer was formed in the reflective layer forming chamber with the $H_2O$ partial pressure inside the reflective layer forming chamber being within the range of $2.6 \times 10^{-3}$ to $6.7 \times 10^{-3}$ Pa. A part of the substrate having the reflective layer formed at the $H_2O$ partial pressure within the range of $2.6 \times 10^{-3}$ to $6.7 \times 10^{-3}$ Pa was put out and measured for reflectance by a spectrophotometer, and the reflectance at 800 nm wavelength was taken as 100% and defined as a comparison standard of reflectance. Further, the substrate having the reflective layer formed was cut into a piece of 5 cm square; the semiconductor layer, the transparent electrode and the current collecting electrode were deposited thereon in a separate apparatus; characteristic evaluation was effected therefor under light irradiation of AM1.5 (100 mW/cm$^2$); and the photoelectric conversion efficiency as obtained therefor was taken as 100% and defined as a comparison standard of photoelectric conversion efficiency.

(Comparative Example 6)

A substrate was produced by following the procedure of Example 10 with the exception that after the vacuum exhaust and gas supply, the rear surface reflective layer consisting solely of the reflective layer and having no transparent conductive layer was formed in the reflective layer forming chamber with the H$_2$O partial pressure inside the reflective layer forming chamber being outside the range of 6.6×10$^{-4}$ to 1.4×10$^{-2}$ Pa. When the thus produced substrate was measured for reflectance by a spectrophotometer, the reflectance at 800 nm wavelength was 88% on the basis of 100% for Example 10. Further, when the photoelectric conversion efficiency was measured, it was 85% on the basis of 100% for Example 10.

(Example 11)

A substrate was produced by following the procedure of Example 1 with the exception that after the vacuum exhaust and gas supply, the rear surface reflective layer consisting solely of the transparent conductive layer and having no reflective layer was formed in the reflective layer forming chamber with the H$_2$O partial pressure inside the reflective layer forming chamber being within the range of 2.6×10$^{-3}$ to 6.7×10$^{-3}$ Pa. A part of the substrate having the transparent conductive layer formed at the H$_2$O partial pressure within the range of 2.6×10$^{-3}$ to 6.7×10$^{-3}$ Pa was put out and measured for reflectance by a spectrophotometer, and the reflectance at 800 nm wavelength was taken as 100% and defined as a comparison standard of reflectance. Further, the substrate having the transparent conductive layer formed was cut into a piece of 5 cm square; the semiconductor layer, the transparent electrode and the current collecting electrode were deposited thereon in a separate apparatus; characteristic evaluation was effected therefor under light irradiation of AM1.5 (100 mW/cm$^2$); and the photoelectric conversion efficiency as obtained therefor was taken as 100% and defined as a comparison standard of photoelectric conversion efficiency.

(Comparative Example 7)

A substrate was produced by following the procedure of Example 11 with the exception that after the vacuum exhaust and gas supply, the rear surface reflective layer consisting solely of the transparent conductive layer and having no reflective layer was formed in the reflective layer forming chamber with the H$_2$O partial pressure inside the reflective layer forming chamber being outside the range of 6.6×10$^{-4}$ to 1.4×10$^{-2}$ Pa. When the thus produced substrate was measured for reflectance by a spectrophotometer, the reflectance at 800 nm wavelength was 88% on the basis of 100% for Example 11. Further, when the photoelectric conversion efficiency was measured, it was 85% on the basis of 100% for Example 11.

As described above, according to the present invention, it is possible to provide a film formation method using sputtering and a production method of a photovoltaic element using the film formation method that attain stable good film formation even during long-time sputter film formation, can constantly form a reflective film with a desired reflectance, has excellent workability and durability, and constantly attain high photoelectric conversion efficiency.

What is claimed is:

1. A film formation method using sputtering comprising introducing a sputtering gas into a film forming chamber and forming a film on a substrate therein, wherein the partial pressures of H$_2$O at the beginning and completion of the film formation are each controlled from not less than 2.6×10$^{-3}$ Pa, to no more than 6.7×10$^{-3}$ Pa in an atmosphere inside the film forming chamber, thereby forming a reflective layer of a prescribed reflectance on the substrate.

2. The method according to claim 1, wherein the partial pressure of H$_2$O is detected during the film formation.

3. The method according to claim 2, wherein the partial pressure of H$_2$O is controlled based on the result of the detection.

4. The method according to claim 3, wherein the partial pressure of H$_2$O is controlled by supplying H$_2$O into the film forming chamber and adjusting the concentration of the H$_2$O.

5. The method according to claim 2, wherein the detection is effected using a tetrode mass spectrometer.

6. The method according to claim 1, wherein prior to the film formation, the interior of the film forming chamber is baked.

7. The method according to claim 1, wherein the film comprises a metal.

8. The method according to claim 7, wherein the metal is Al, Ag or Cu.

9. The method according to claim 1, wherein the film comprises a metal oxide.

10. The method according to claim 9, wherein the metal oxide is a metal oxide containing at least one selected from Al, In, Sn, Zn, and Ti.

11. The method according to claim 1, wherein the substrate is a belt-shaped substrate, and the film is formed on the belt-shaped substrate while successively moving the belt-shaped substrate.

12. A method of producing a photovoltaic element comprising a rear surface reflective layer, a photoelectric conversion layer and a transparent electrode layer on a substrate, comprising forming the rear surface reflective layer using the film formation method as set forth in any one of claims 1 and 2–11.

13. A method of producing a photovoltaic element comprising a transparent conductive layer, a photoelectric conversion layer and a transparent electrode layer on a substrate, comprising forming the transparent conductive layer using the film formation method as set forth in any one of claims 1 and 2–11.

14. A method of producing a photovoltaic element comprising a rear surface reflective layer, a transparent conductive layer, a photoelectric conversion layer and a transparent electrode layer on a substrate, comprising forming at least one of the rear surface reflective layer and the transparent conductive layer using the film formation method as set forth in any one of claims 1 and 2–11.

15. A film formation method using sputtering comprising introducing a sputtering gas into a film forming chamber and forming a zinc oxide film on a substrate therein, wherein the partial pressures of H$_2$O at the beginning and completion of the film formation are each controlled from not less than 2.6×10$^{-3}$ Pa, to no more than 6.7×10$^{-3}$ Pa in an atmosphere inside the film forming chamber.

16. The method according to claim 15, comprising prior to the formation of the zinc oxide film, forming a metal film comprised of aluminum or silver on a surface of the substrate by sputtering.

17. A production method of a photovoltaic element comprising forming a zinc oxide film on a substrate using the film formation method as set forth in claim 15 and then forming a semiconductor film on the zinc oxide film.

* * * * *

UNITED STATES PATENT AND TRADEMARK OFFICE
CERTIFICATE OF CORRECTION

PATENT NO. : 6,554,973 B2  
DATED : April 29, 2003  
INVENTOR(S) : Akiya Nakayama It is certified that error appears in the above-identified patent and that said Letters Patent is hereby corrected as shown below:

<u>Column 12,</u>
Line 37, "1 and 2-11." should read -- 1-11. --; and
Line 49, "claims 1 and 2-11." should read -- claims 1-11. --.

Signed and Sealed this

Twentieth Day of January, 2004

JON W. DUDAS
*Acting Director of the United States Patent and Trademark Office*